(12) United States Patent
Lin et al.

(10) Patent No.: US 6,930,926 B2
(45) Date of Patent: Aug. 16, 2005

(54) METHOD FOR ERASING A FLASH EEPROM

(75) Inventors: Yu-Shen Lin, Taipei (TW); Shin-Jang Shen, Changhua (TW); Chun-Hsiung Hung, Hsinchu (TW); Ho-Chun Liou, Hsinchu (TW); Shuo-Nan Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 86 days.

(21) Appl. No.: 10/354,175

(22) Filed: Jan. 30, 2003

(65) Prior Publication Data

US 2003/0161187 A1 Aug. 28, 2003

(30) Foreign Application Priority Data

Jan. 31, 2002 (TW) ........................ 91101712 A

(51) Int. Cl.[7] ............... G11C 16/04; G11C 16/06
(52) U.S. Cl. ................... 365/185.29; 365/185.22; 365/185.28
(58) Field of Search ............... 365/185.29, 185.28, 365/185.24, 185.22

(56) References Cited

U.S. PATENT DOCUMENTS

| | | | | |
|---|---|---|---|---|
| 6,331,951 B1 * | 12/2001 | Bautista et al. | ........ | 365/185.22 |
| 6,356,481 B1 * | 3/2002 | Micheloni et al. | ..... | 365/185.23 |
| 6,438,037 B1 * | 8/2002 | Fastow et al. | ......... | 365/185.22 |
| 6,483,752 B2 * | 11/2002 | Hirano | ................... | 365/185.33 |
| 6,490,197 B1 * | 12/2002 | Fasoli | .................... | 365/185.04 |
| 6,496,417 B1 * | 12/2002 | Shiau et al. | ............. | 365/185.2 |
| 6,590,811 B1 * | 7/2003 | Hamilton et al. | ....... | 365/185.22 |
| 2002/0008996 A1 * | 1/2002 | Hirano | ................... | 365/185.33 |
| 2002/0018368 A1 * | 2/2002 | Visconti | ................ | 365/185.18 |
| 2002/0031012 A1 * | 3/2002 | Chen et al. | ............ | 365/185.26 |
| 2002/0133679 A1 * | 9/2002 | Choi et al. | .................. | 711/154 |
| 2002/0176280 A1 * | 11/2002 | Pasternak | .............. | 365/185.21 |
| 2003/0005184 A1 * | 1/2003 | Roohparvar | ................... | 710/1 |
| 2003/0021155 A1 * | 1/2003 | Yachareni et al. | ..... | 365/185.22 |
| 2003/0048664 A1 * | 3/2003 | Chevallier | ............. | 365/185.22 |
| 2003/0072182 A1 * | 4/2003 | Keays | .................... | 365/185.33 |
| 2003/0074152 A1 * | 4/2003 | Kessenich et al. | .......... | 702/117 |
| 2003/0112671 A1 * | 6/2003 | Wooldridge | ................ | 365/200 |
| 2004/0027894 A1 * | 2/2004 | Lee et al. | ................... | 365/202 |

* cited by examiner

Primary Examiner—Hoai Ho
Assistant Examiner—Ly Duy Pham
(74) Attorney, Agent, or Firm—Rabin & Berdo PC

(57) ABSTRACT

A method for erasing a flash EEPROM. The flash EEROM includes a number of memory units. First, the flash EEPROM is pre-programmed. Second, the step of erasing the flash EEPROM is performed and the flash EEPROM is then soft-programmed. Subsequently, the final step is performed to determine if the erasing step succeeds.

4 Claims, 3 Drawing Sheets

METHOD FOR ERASING A FLASH EEPROM

This application claims the benefit of Taiwan application Serial No. 091101712, filed Jan. 31, 2002.

BACKGROUND OF THE INVENTION

1. Field of the Invention

The invention relates in general to the method for erasing a memory, and more particularly to the method for erasing a flash EEPROM.

2. Description of the Related Art

The flash EEPROM (Electrically Erasable Programmable Read Only Memory) has the advantages of preserving data with no power supplied, and the ability of erasing and writing data. FIG. 1 is a diagram showing a memory unit of the flash EEPROM. The memory unit stores a 1-bit data. The memory unit includes a control gate CG, a floating gate FG, a source S, and a drain D. The data stored in the memory unit is determined by the amount of charges contained in the floating gate FG. For example, the memory unit stores the data of 0 if the floating gate FG contains large amount of charges, and accordingly a high threshold voltage, such as higher than 5 V, is needed to apply to the control gate CG to electrically connect the source S and the drain D. The memory unit stores the data of 1 if the floating gate FG contains small amount of charges, and accordingly a low threshold voltage, such as lower than 3.2V, is needed to apply to the control gate CG to electrically connect the source S and the drain D.

The approach to write a data of 0 to the memory unit is to apply a high voltage, such as 10V, to the control gate CG, a voltage of 6V to the drain D, and a voltage of zero to the source S. Accordingly, a large amount of charges are put into the floating gate FG, and thus the threshold voltage becomes high. The approach to write a data of 1 to the memory unit is to apply a negative voltage, such as –11V, to the control gate CG and a voltage of 3V to the source S. Accordingly, the charges in the floating gate FG are removed, and thus the threshold voltage becomes low.

FIG. 2 is an exemptary diagram of the threshold voltage distribution. The Y-axis represents voltage, and the X-axis represents number of the memory units. The threshold voltages of the memory units located at the area H are larger than 5V, and thus each memory unit stores data of 0. The threshold voltages of the memory units located at the area L are lower than 3.2V, and thus each memory unit stores data of 1. The approach for reading the data stored in a memory unit is to apply a reading voltage, such as 4V, to the memory unit. Subsequently, the memory unit located at the area H is turned on, and the memory unit located at the area L is not turned on. Then, the data stored in a memory unit can be determined according to the magnitude of the current flowing by the memory unit.

The method for erasing a flash EEPROM includes steps of pre-programming, erasing, and soft-programming. In the step of pre-programming, the data of 0 is written to memory units of the flash EEPROM for stabilizing the step of erasing. In the step of erasing, the data of 1 is written to each memory units. Nevertheless, excessive charges are possibly removed from some of the floating gates because the erasing step is performed on a block of memory units at the same time. Accordingly the threshold voltages of some memory units are too low, or even below zero. Thus, the step of soft-programming is required to tighten the distribution area L for avoiding the too-low threshold voltages. The step of soft-programming is performed by applying a voltage of 3V to the control gate CG and a voltage of 5V to the drain D.

FIG. 3 is a flowchart of a well-known method for erasing a flash EEPROM. The flash EEPROM is first pre-programmed in step 220 and then erased in step 230. The step of determining if the step of erasing is succeeded is performed in step 240. If the flash EEPROM is erased successfully, the procedure proceeds to step 250; otherwise it returns to step 230 for re-erasing. In step 250, the flash EEPROM is soft-programmed and then the method ends.

A large current may be needed while processing the soft-programming step. Because the soft-programming step is performed after the success of the erasing step is ensured. The erasing step may possibly be processed for several times until success, which may generate a large number of memory units with too-low threshold voltages. Accordingly, the soft-programming step requires a large current to tighten the distribution of the threshold voltages. However, the flash EEPROM is commonly used in the low-voltage environment, which may not supply such a large current.

SUMMARY OF THE INVENTION

It is therefore an object of the invention to provide a method for erasing the flash EEPROM suitable for the low-voltage environment.

The invention achieves the above-identified objects by providing a new method for erasing a flash EEPROM. The flash EEROM includes memory units. First, the flash EEPROM is pre-programmed. Second, the step of erasing the flash EEPROM is performed and the flash EEPROM is then soft-programmed. Subsequently, the final step is performed to determine if the erasing step succeed.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1:
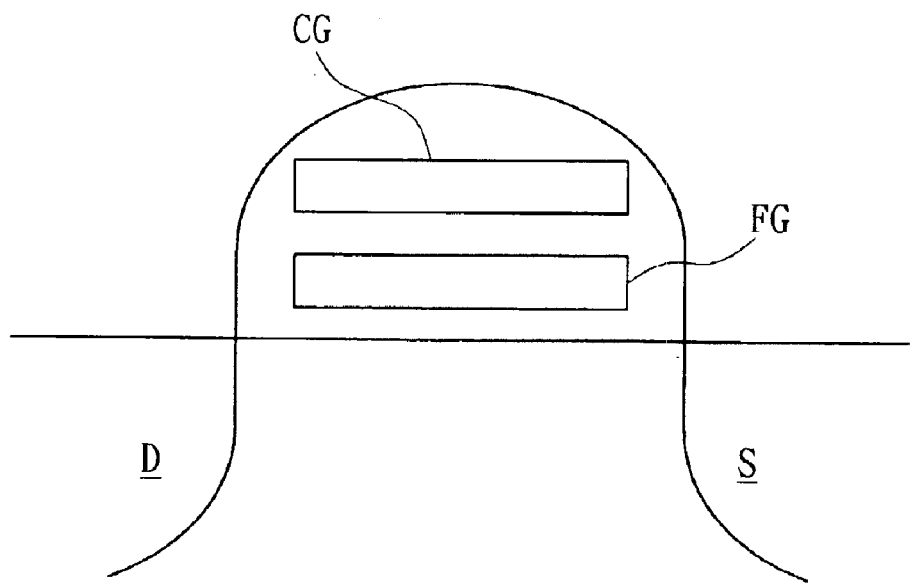
FIG. 1 is a diagram showing a memory unit of the flash EEPROM.
Figure 2:
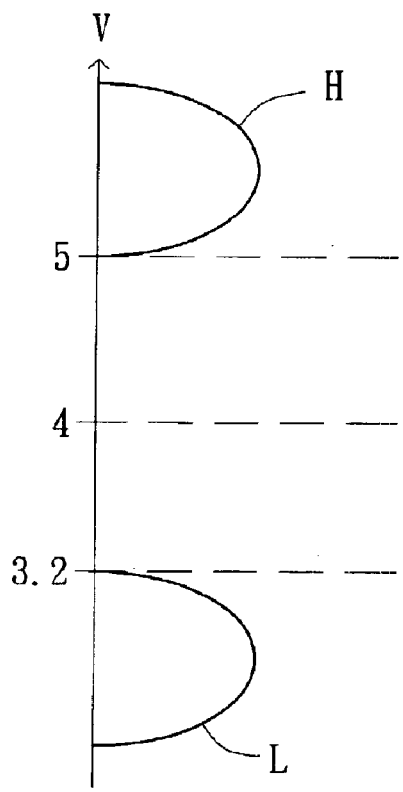
FIG. 2 is a diagram of the threshold voltage distribution.
Figures 3, 4, 5:
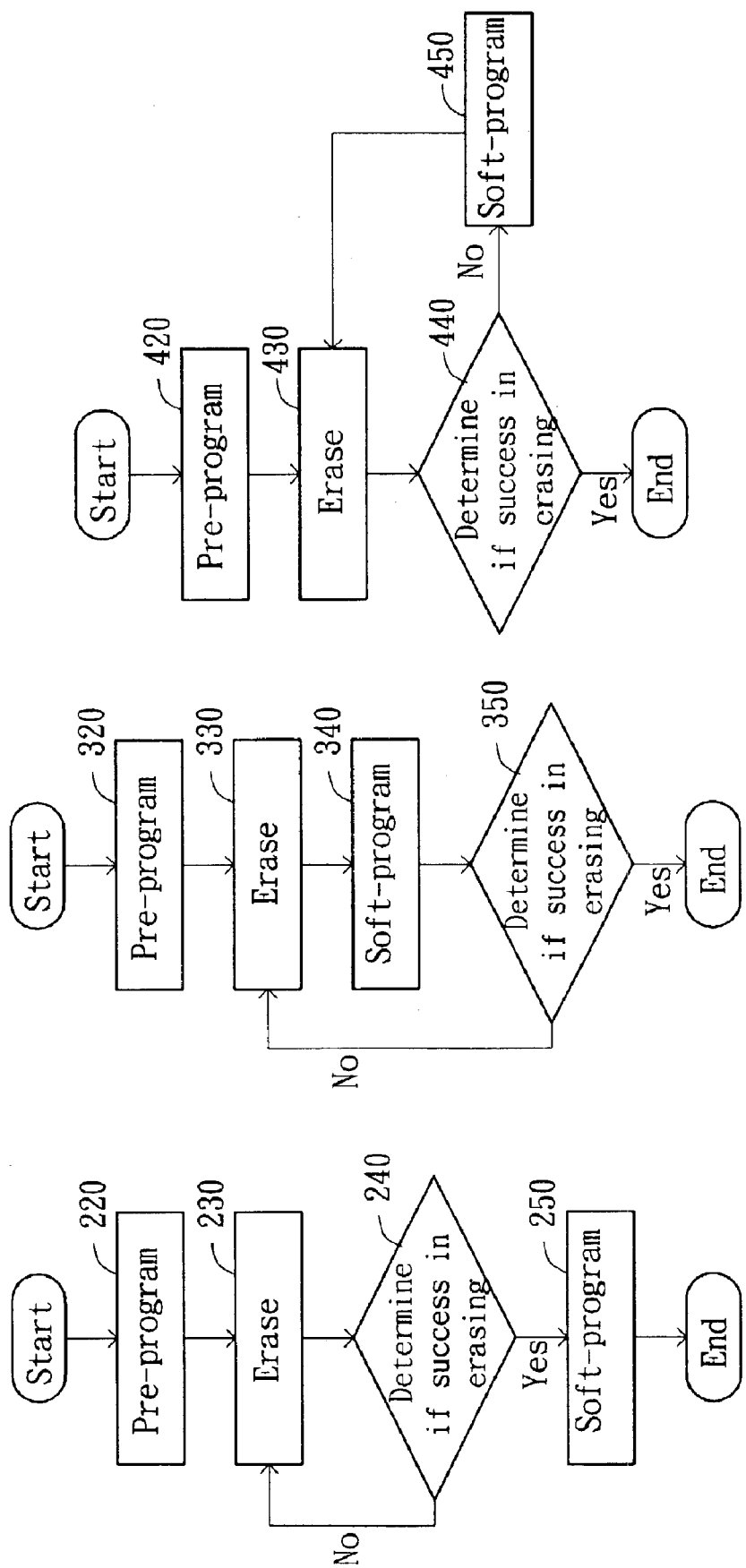
FIG. 3 is a flowchart of a well-known method for erasing a flash EEPROM.
FIG. 4 is a flowchart of a method for erasing a flash EEPROM according to the first embodiment of the invention.
FIG. 5 is a flowchart of a method for erasing a flash EEPROM according to the second embodiment of the invention.

FIG. 4 is a flowchart of a method for erasing a flash EEPROM according to the first embodiment of the invention. In step 320, the flash EEPROM is first pre-programmed. Then, the flash EEPROM is erased in step 330 and soft-programmed in step 340 to tighten the distribution of the threshold voltages. If a determination that the step of erasing succeeds is made in step 350, the method ends. Otherwise, the procedure returns to step 330 for re-erasing. The approach to determine the success of erasing is to read the data stored at each memory unit. If each of the memory units stores 1, the erasing step succeeds.

Conventionally, the flash EEPROM is soft-programmed after ensuring the erasing step succeeds. Instead, the flash EEPROM is soft-programmed every time after the erasing step is performed in the first embodiment of the invention. The current consumed by the soft-programming step is therefore decreased as compared with the traditional approach, and the distribution of the threshold voltages is tightened better.

FIG. 5 is a flowchart of a method for erasing a flash EEPROM according to the second embodiment of the invention. The flash EEPROM is first pre-programmed in step 420 and then erased in step 430. The step of determining if the step of erasing is succeeded is performed in step 440. If the flash EEPROM is erased successfully, the method ends. If not, the procedures proceed to step 450. In step 450, the flash EEPROM is soft-programmed to tighten the distribution of the threshold voltages, and then the procedures return to step 430.

In the second embodiment, the flash EEPROM is soft-programmed every time after determining that the erasing step is unsuccessful. The current consumed by the soft-program step is decreased as compared with the traditional approach. Besides, it is able to tighten the distribution of the threshold voltages more efficiently.

Figure 6:
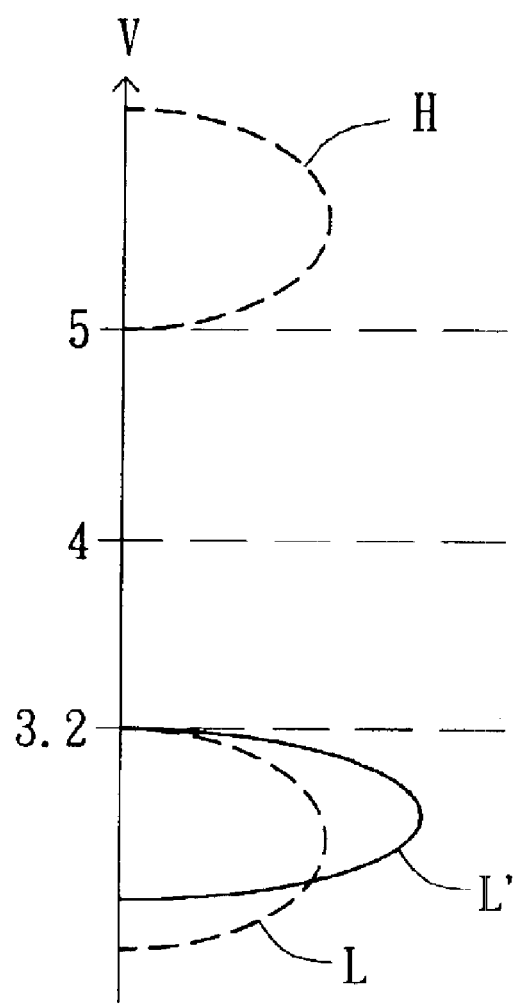
FIG. 6 is a distribution diagram of the threshold voltages after erasing according to the invention.

FIG. 6 is a distribution diagram of the threshold voltages after erasing according to the invention. As shown in FIG. 6, the distribution area L represents the result by the traditional approach while the distribution area L' represents the result by the invention. It shows that the invention tightens the distribution and better the traditional approach in the low-voltage environment.

The method for erasing a flash EEPROM according to the invention is suitable for the low-voltage environment due to its less consumption of current. In addition, it is able to tighten the distribution of the threshold voltages more efficiently While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for erasing a flash EEPROM, the flash EEROM including a plurality of memory units, the method comprising the steps of:

(a) pre-programming the flash EEPROM;

(b) erasing the flash EEPROM, and then soft-programming the flash EEPROM; and (c) then determining if the flash EEPROM is erased successfully; and (d) re-performing said step (b), when the flash EEPROM is erased unsuccessfully.

2. The method according to claim 1, wherein said step (a) comprises writing a first value to each of the memory units.

3. The method according to claim 2, wherein erasing the flash EEPROM in said step (b) further comprises writing a second value to each of the memory units.

4. The method according to claim 3, wherein said step (c) comprises determining if each of the memory units contains the second value.

\* \* \* \* \*